United States Patent [19]

Dorri et al.

[11] Patent Number: 5,045,794
[45] Date of Patent: Sep. 3, 1991

[54] METHOD OF OPTIMIZING PASSIVE SHIM PLACEMENT IN MAGNETIC RESONANCE MAGNETS

[75] Inventors: Bizhan Dorri, Clifton Park; Mark E. Vermilyea, Schenectady, both of N.Y.

[73] Assignee: General Electric Company, Schenectady, N.Y.

[21] Appl. No.: 445,510

[22] Filed: Dec. 4, 1989

[51] Int. Cl.$^5$ ............................................. G01R 33/20
[52] U.S. Cl. ................................................... 324/320
[58] Field of Search ............... 335/214, 216, 299, 301, 335/304; 324/318, 319, 320

[56] References Cited

U.S. PATENT DOCUMENTS 4,761,614 8/1988 Prammer et al. .................... 324/307
4,853,663 8/1989 Vermilyea ............................ 324/320

Primary Examiner—Michael J. Tokar
Attorney, Agent, or Firm—Patrick R. Scanlon; James C. Davis, Jr.; Paul R. Webb, II

[57] ABSTRACT

A method of passively shimming a magnet having a central bore using ferromagnetic shims is provided. The field strength in the bore of the magnet is measured at a predetermined number of points. The field inhomogeneity is determined from the measured field strengths. The fields created by a single shim of known size when positioned, at different predetermined positions in the bore of the magnet is determined. The shim locations in the bore of the magnet and shim size are determined using a linear programming solver to minimize the field inhomogeneity and the total amount of shims used. The shim sizes are determined based on the measured field in the bore of the magnet and the field created by a single shim when positioned at a predetermined number of locations. The shim size at the appropriate locations are adjusted to the determined values and the field strength of the magnet is again measured at the predetermined points. The inhomogeneity is determined with the shims in place and compared to a desired value of inhomogeneity. If the inhomogeneity is greater than desired, then shim placement and shim size are again determined, the shims put in place, and the field measured again until the desired inhomogeneity is achieved.

7 Claims, 5 Drawing Sheets

METHOD OF OPTIMIZING PASSIVE SHIM PLACEMENT IN MAGNETIC RESONANCE MAGNETS

CROSS REFERENCE TO RELATED APPLICATIONS

This application is related to copending application Serial No. (RD-19,395) entitled "Method of Optimizing Shim Coil Current Selections in Magnetic Resonance Magnets" assigned to the same assignee as the present invention.

BACKGROUND OF THE INVENTION

The present invention relates to a method of determining the location and thickness of passive shims in magnetic resonance magnets to maximize the magnetic field homogeneity in the bore of the magnet.

In magnetic resonance (MR) magnets a uniform magnetic field is used to polarize the hydrogen nuclei in the subject being examined. Magnetic field inhomogeneities will distort the position information in the scan volume and degrade the image quality. In chemical shift spectroscopy the chemically shifted frequency peaks are often separated by a fraction of one part per million, requiring high field homogeneity. To create a highly uniform magnetic field with an electromagnet, it is necessary to build the magnet to a carefully specified shape, and to strive to minimize the deviations from the specified shape due to manufacturing variations. The resulting magnet, however, typically requires field correction to achieve the desired level of homogeneity, due to deviations of the magnet from the design or due to the presence of ferromagnetic material in the vicinity of the magnet.

To improve field uniformity, correction coils are typically used. These coils are capable of creating different field shapes which can be superimposed on an inhomogeneous main magnetic field to perturb the main magnetic field in a manner which increases the overall field uniformity. Many sets of such coils are typically required. The state of the art magnetic resonance imaging magnet has between 10 and 20 independent sets of correction coils, each with its own power supply to provide the correct current flow. The correction coils may be resistive, superconducting or a combination of both. These coils add significantly to the cost and complexity of the magnet.

One way of removing the need for correction coils is to shim the magnet passively, using only pieces of iron to bring an initially inhomogeneous field to within imaging homogeneity specifications. The iron may be placed outside the magnet or in its bore; the latter method has the advantage of reducing the volume of iron required and thereby reducing any addition to the magnet size and weight. Such a system would be much cheaper and more reliable than the typical set of correction coils. The primary difficulty in implementing such a shimming method lies in predicting the locations and sizes of iron pieces required to shim the field. Electromagnetic coils are generally designed to produce certain terms of a spherical harmonic field expansion. Such a design criterion becomes difficult with passive shims for two reasons, the inability to specify a field reversal in the iron and the size and complexity of the groups of pieces required to produce primarily a single harmonic. Since magnetic coupling between the shims is also a complicating factor, shimming with large pieces, which inevitably become physically close, becomes difficult.

The more elegant and efficient solution is to use many small pieces of iron, placed at strategic locations, to correct the field. The iron may be configured to apply small corrections near the parts of the imaging volume which are close to optimized already, and large corrections where it isn't.

The difficulty with this solution is in predicting the necessary locations as well as the thickness of the shims since the number of possible shim locations and thicknesses is generally large.

A number of MR magnet manufacturers have investigated passively shimming their magnets from a standpoint of removing field shapes which are of a shape or magnitude which the correction coils alone cannot handle, thus rendering the magnet shimmable with the correction coils. Some manufacturers have offered magnet systems which are passively shimmed, i.e. no correction coils are used. U.S. Pat. No. 4,771,244. describes a method using linear least squares algorithm for passive shimming optimization. Even though this algorithm has been successfully used for a few passive shimming cases, in some "difficult to shim" cases, it cannot bring the field inhomgeneity down to acceptable levels.

It is an object of the invention to determine the optimum locations and thicknesses of passive shims which produce homogeneous magnetic fields within MR magnets.

It is an object with the present invention to provide a method of shimming MR magnets using only pieces of ferromagnetic material to provide homogeneous magnetic fields within the magnets.

SUMMARY OF THE INVENTION

In one aspect of the present invention a method of passively shimming a magnet having a central bore using ferromagnetic shims is provided. The field strength in the bore of the magnet is measured at a predetermined number of points. The field inhomogeneity is determined from the measured field strengths. The fields created by a single shim of known size when positioned, at different predetermined positions in the bore of the magnet is determined. The shim locations in the bore of the magnet and shim size are determined using a linear programming solver to minimize the field inhomogeneity and the total amount of shims used. The shim sizes are determined based on the measured field in the bore of the magnet and the field created by a single shim when positioned at a predetermined number of locations. The shim sizes at the appropriate locations are adjusted to the determined values and the field strength of the magnet is again measured at the predetermined points. The inhomogeneity is determined with the shims in place and compared to a desired value of inhomogeneity. If the inhomogeneity is greater than desired, then shim placement and shim size are again determined, the shims put in place, and the field measured again until the desired inhomogeneity is achieved.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with accompanying figures in which:

DETAILED DESCRIPTION OF THE INVENTION

Figure 1:
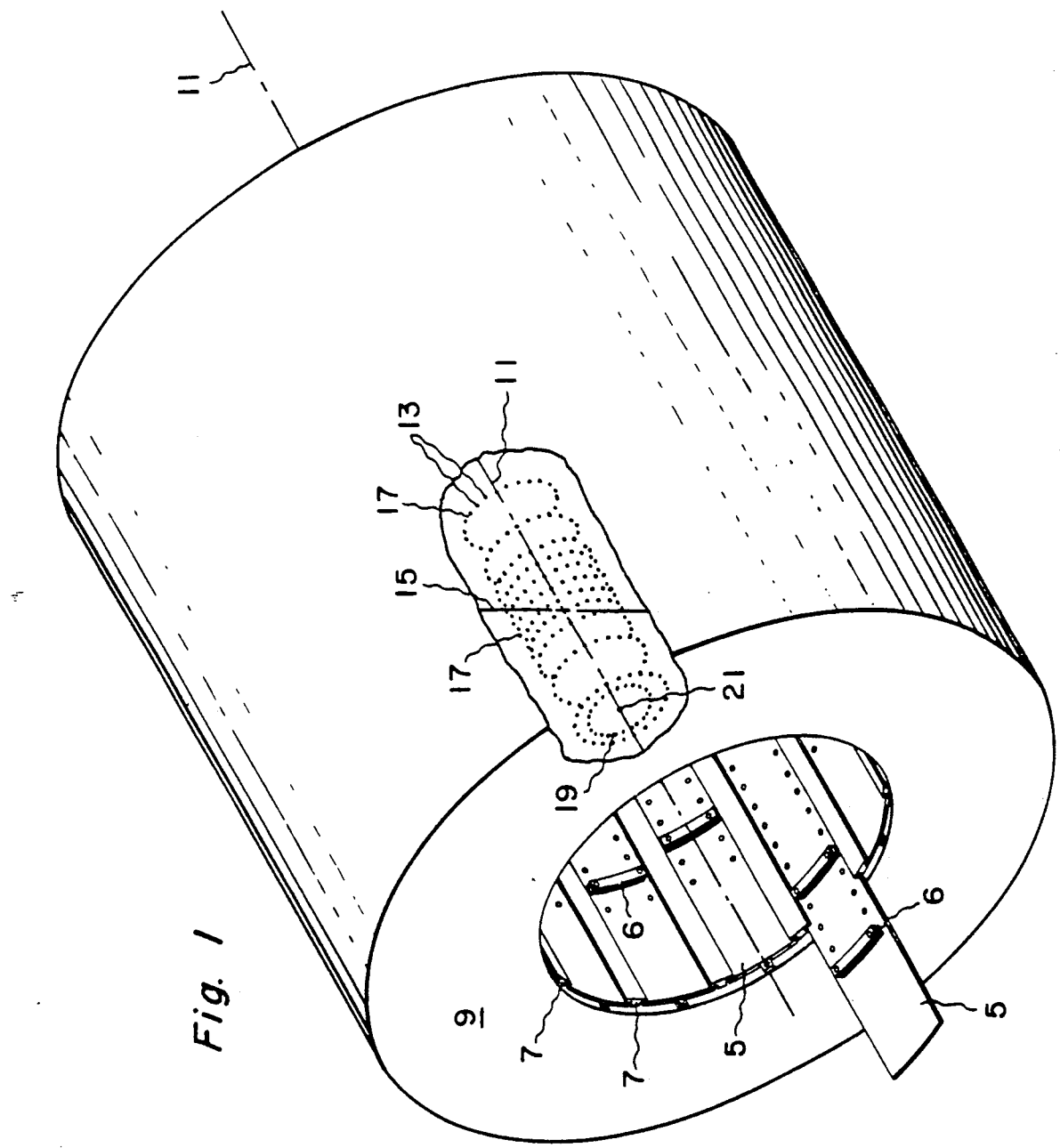
FIG. 1 is a partially cutaway isometric of a MR magnet and an imaginary cylindrical grid inside the magnet bore where field measurements are taken.

To predict ferromagnetic shim placement and thickness for achieving a global minimum peak to peak inhomogeneity, where peak to peak inhomogeneity is the difference between the highest measured field value anywhere in the volume of interest and the lowest measured field value anywhere in the volume of interest, the problem is formulated as a linear programming problem. Linear programming is a mathematical technique for maximizing or minimizing a linear equation called an objective function whose variables are restricted to values satisfying a system of linear constraints. Solving linear programming problems can be accomplished by several well known techniques. However, formulating the problem is an art in itself for which there are no simple methods or rules available. In the present invention, the objective function is to minimize total amount of shim used plus field tolerance (inhomogeneity). The constraints include having the field values at every measured point being within half of the tolerance of the mean value of the overall field. The mean value of the overall field is one half the sum of the maximum and minimum field values anywhere in the measured field. The objective function is shown in Equation 1. N is the total number of shim locations. M is the total number of points at which field is measured. $X_i$ is the thickness of the shim at location i and A is a weighting factor. T is the peak to peak field tolerance beyond the allowable tolerance E. $X_i$ and T are unknown variables.

$$\text{MINIMIZE} \sum_{i=1}^{N} AX_i + T \quad (1)$$

Subject to:

$$\sum_{i=1}^{N} \Delta B_{ij}X_i + BM_j - BMEAN \leq T/2 + E/2 \text{ for } j = 1 \text{ to } M \quad (2)$$

$$\sum_{i=1}^{N} \Delta B_{ij}X_i + BM_j - BMEAN \geq T/2 - E/2 \text{ for } j = 1 \text{ to } M \quad (3)$$

All $X_i$'s $\geq 0$ \quad (4)

The objective function (equation 1) needs to be minimized subject to the constraints in equations 2 and 3. Equations 2 and 3 provide the constraints for having field values of every measured point to be within half of the tolerance of the mean value of the field strength of all of the points. BMEAN is an unknown variable representing the mean value between the maximum and minimum field strength anywhere in the measured field.

The equations are set up to handle N shims. The field is measured at M points inside the bore of the magnet The term $\Delta B_{i,j}$ represents the change in magnitude of the field at point j caused by predetermined size shim i. This value can be determined by actually positioning the shim sequentially at a predetermined number of locations and measuring the field at all M points for each shim location selected. If the field is determined for each shim in an axial direction, the effects of a shim in each of the other circumferential positions can be found using symmetry. The effect of a shim on the field can alternatively be determined. The term $BM_j$ represents the field value at point j in the bore of the magnet.

In one embodiment of the present invention, there are 300 possible shim locations and 314 measured field points. This results in a linear programming problem of 302 variables and 628 constraints. While $X_i$, T, and BMEAN are unknown variables only $X_i$ is an independent variable with T and BMEAN dependent variables, since once all the $X_i$ have been determined T and BMEAN can be determined. The linear program approach however, determines $X_i$, T, and BMEAN simultaneously.

The linear programming problem with 302 variables and 628 constraints can be solved using any linear programming algorithm. However, due to the high density of the coefficient matrix (most of the variables within the constraints have non-zero coefficients) used to solve the linear programming problem .computation time would be high for a standard linear programming algorithm.

Examining the formulation suggests that both phase 1 and phase 2 of a linear program needs to be solved. This is due to the fact that some of the constraints when expressed in less than or equal to form have a negative right-hand side. Phase 1 is systematic method of finding a basic feasible solution or determining that none exists. A basic feasible solution is one that meets all the constraints but does not necessarily minimize the objective function. Once an initial basic feasible solution has been determined, an optimal solution is determined in phase 2.

If the linear programming problem is expressed in its dual form, the resulting problem will have 628 variables and 302 constraints and only the phase 2 problem needs to be solved, since zero is a feasible solution. A linear programming problem which has n variables and m inequalities and a linear objective function which is to be minimized has a dual with m variables, n inequalities and a linear objective function which is to be maximized. The sign of the inequalities is opposite that of the original or primal system. Also, the coefficients on the right-hand side of the equation are those of the objective function of the other system and the coefficients are the same in both systems except that the columns in one correspond to the rows in the other, and vice versa. Of course any of the two systems can be taken as the primal, and the other is then the dual. The dual of equations 1-3 is shown in equations 5-8. The Y's are dual variables which do not have any physical meaning as far as this particular problem is concerned.

$$\text{MAXIMIZE} \sum_{j=1}^{M} \left[ \left( BM_j - \frac{E}{2} \right) Y_j - \left( BM_j - \frac{E}{2} \right) Y_{M+j} \right] \quad (5)$$

-continued $$\text{SUBJECT TO:} - \sum_{j=1}^{M} [\Delta B_{i,j}(Y_j - Y_{M-j})] \leq A \text{ for } i = 1 \text{ to } N \quad (6)$$

$$\sum_{j=1}^{M} (Y_j - Y_{M-j}) \leq 0 \quad (7)$$

$$\sum_{j=1}^{2M} 0.5 \, Y_j \leq 1 \quad (8)$$

Because of the specific connection between the primal and dual systems there is a connection between the solutions. The linear programming algorithms simultaneously solves two linear programming problems, the primal and the dual. In the present situation, the linear programming problem is reformed into its dual and the dual solution of the dual problem represents the original primal solution.

There are many methods for solving linear programming problems such as the simplex, revised simplex, dual simplex, and Karmarkar's. The revised simplex method is an efficient way for solving this problem since many of the computations during pivoting operations can be reduced for the vertically symmetric coefficient matrix. In addition, computer storage can be reduced by having to store only half of the coefficient matrix.

In order to use linear programming to determine the shim placement and thickness, the field present in the bore of the magnet needs to be measured. FIG. 1 shows twelve axially extending arcuate shaped carrying drawers 5 carrying shims 6 held by twelve rails mounted directly to the bore of the vacuum vessel 9 of the cryostat of a magnet. The drawers are removable by sliding them axially allowing access to the twenty-five shim positions on each drawer. Since the field inside a volume positioned about the center of the bore becomes more inhomogeneous as you move away from the center of the bore, only the periphery of the volume of interest needs to be measured. Once the inhomogeneity of the periphery of the volume of interest is reduced, the inhomogeneity inside the volume will become at least as small and probably smaller than the inhomogeneity at the periphery. One series of measurement points is shown in FIG. 1 and involves an imaginary cylindrical volume having a longitudinal axis 11 which is aligned with the longitudinal axis of the bore. The measurement points are shown as dots 13 in FIG. 1. The center of the measured volume is coincident with the center of the bore which occurs at the intersection of the longitudinal axis with the centerline 15 of the cylinder The measurement cylinder is 40 cm. long and has a diameter of 30 cm. Eleven imaginary circles 17 with a 30 cm. diameter are spaced along the cylindrical volume each having 24 points equally circumferentially spaced about the perimeter of each of the circles. Additional imaginary circles 19 with a diameter of 20 cm. (one of which is not shown) are each located concentric with a respective one of the two end circles 17. The 20 cm. diameter circles also have 24 points each equally circumferentially spaced. Two additional points 21 (one of which is not shown) are located at the center of each of the 20 cm. diameter circles to provide the total of 314 points.

Figure 2:
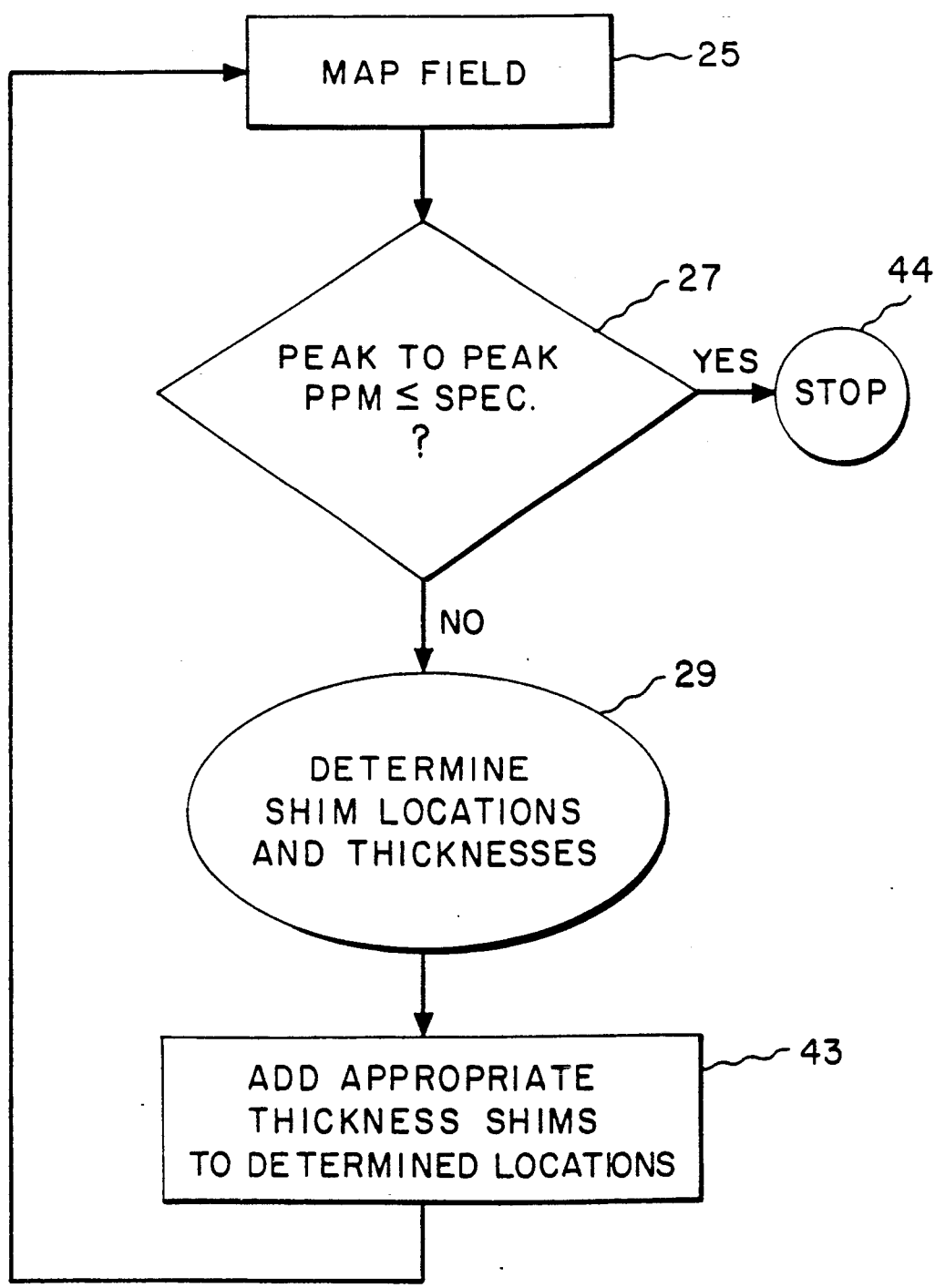
FIG. 2 is a flow chart showing the steps in passively shimming a magnet in accordance with the present invention.
Figure 3:
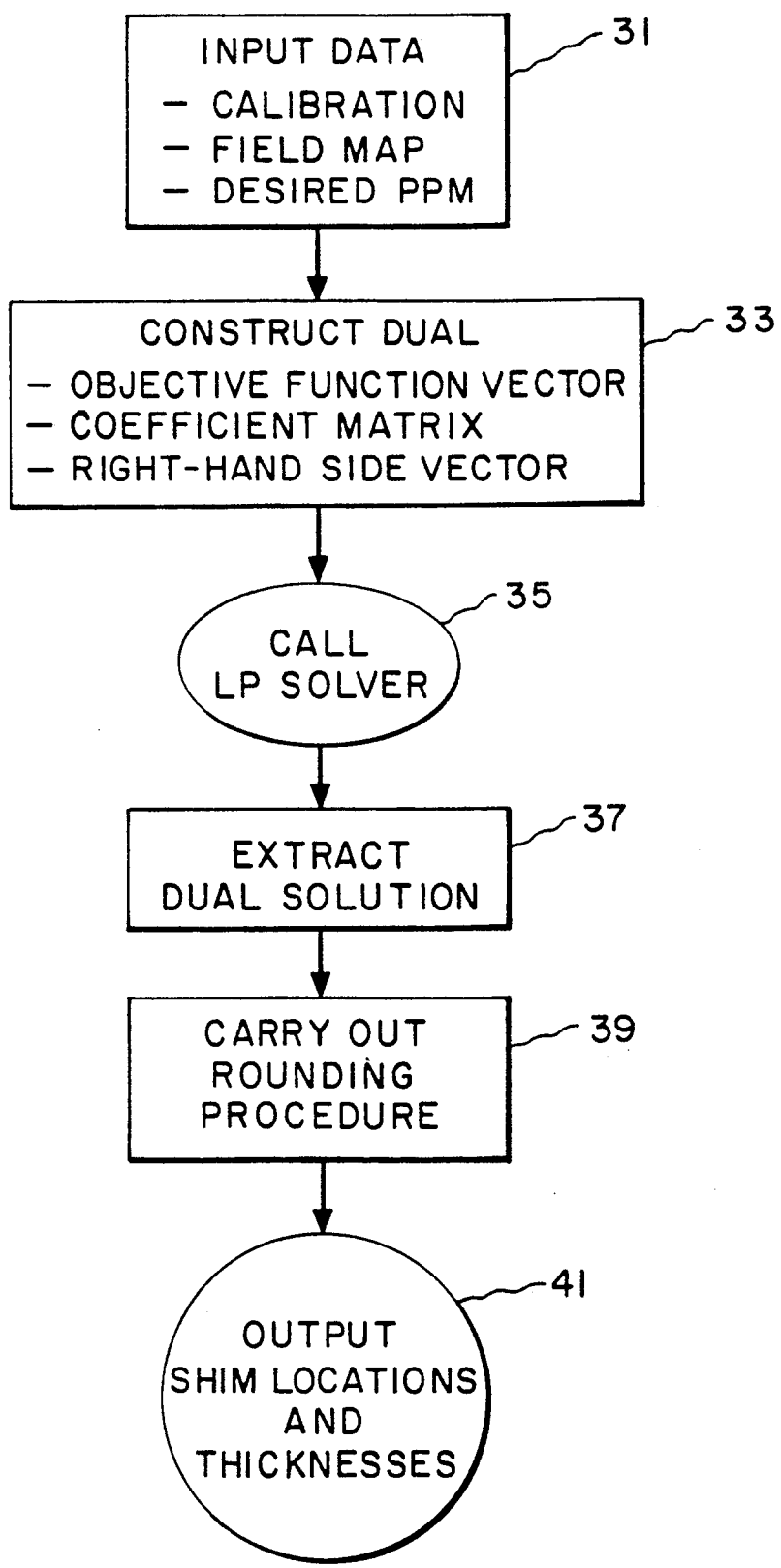
FIG. 3 shows the steps followed in determining the amounts and location of the shims in more detail in flow chart form in accordance with the present invention.

Referring now to FIG. 2, a flow chart showing the steps of the method of the present invention is shown. In block 25 the field strength is measured at each of the measurement points to map the field in the bore of the energized magnet. Next, in decision block 27 the peak to peak field measured between the highest and lowest values of all the 314 points is compared to the desired peak to peak field. If the peak to peak field is greater than desired, the code for determining the shim placement and thicknesses is run in block 29. A flow chart showing the steps carried out in block 29 in determining the shim placement and thicknesses is shown in FIG. 3. First in block 31 of FIG. 3, data is needed regarding the effect of each of the shims individually on the magnetic field at each of measurement points. This data can be determined by positioning a shim of known thickness, such as 100 mils, for example, sequentially in each of the positions available in one drawer and measuring its strength at the 314 points of each of the shim coils. The effect of a single shim in each of the other drawers can then be determined by symmetry. This can be done once and used in all magnets of the same design or redone for every magnet to be shimmed. The field can be measured for each shim location rather than relying on symmetry to determine the effect on the field of the shim. Alternatively, a finite element analysis can be performed to determine the field strength at the 314 points. The weighting factor A in equation 1 is selected to be a small value if the peak to peak measured field is large and a larger value if the peak to peak field is close to the desired amount. The weighting factor effects where the emphasis in the objective function to be minimized is to be placed. If the weighting factor is small, then minimizing of the field is more important than limiting the total amount of shims used. If the weighting factor is larger, then achieving improved field homogeneity with a small total additional thickness of shims becomes more important. As an example, the weighting factor can be set equal to 30/peak to peak ppm. The weighting factor will be small for a magnet which has a large field inhomogeneity and larger for a magnet with a smaller inhomogeneity. The allowable field inhomogeneity E is provided so that the total amount of shims can be reduced. If E is set equal to zero, additional shim material will be needed to attempt to further reduce field inhomogeneity.

The dual linear programming problem is constructed in block 33 based on the field map and the effect of a shim at each permissible shim location. Once the objective function vector of the dual together with the coefficient matrix and right-hand side vector of the dual have been established based on the dual of equations 1-4, shown in equations 5-8 the linear program solver is called in block 35. The dual solution of the dual problem is extracted in block 37 to provide the shim locations and thicknesses of the shims at each of these locations. In block 39 the shim thicknesses are rounded, to two tenths of a mil, for example, by determining if rounding up or down results in the least inhomogeneity. The shim locations and thicknesses are supplied in block 41 to block 43 in FIG. 2. Referring again to FIG. 2, the shims of appropriate thickness are placed in the appropriate locations of each of the drawers in block 43. The PSHIM code can be run on a portable PC with a memory requirement of less than 0.8 MB. The code takes approximately five to twenty minutes to run.

The field is again mapped in block 25 with the shims and the peak to peak ppm inhomogeneity again determined. If the field still is more inhomogeneous than desired, as determined in decision block 27, the code in block 29 is run again. If the desired inhomogeneity has been achieved, the method is completed in block 44.

The weighting factor is changed since the ppm error has been reduced making minimizing the total amount of shims more important than it was previously. The tolerance still needs to be minimized, however.

When the peak to peak ppm is close to the desired level, any increase in shims should be small to minimize the difference between the resulting field and the predicted field. The linear programming equation assumes no interaction between different shims and further that the field produced by the shims varies linearly with shim thickness. These approximations yield accurate results particularly when the changes in total shim thicknesses are small.

When the shims are installed to reflect the additions predicted by the code, the field is again mapped. If the peak to peak inhomogeneity is within the specification, an acceptable shim configuration has been found and the method has been completed. If the inhomogeneity is still too large, the code can be run again and additional shims provided.

In the embodiment shown in FIGS. 1-3 shims once added at a location cannot be removed. There is also no limit to the shim thickness at any one location.

Figure 4:
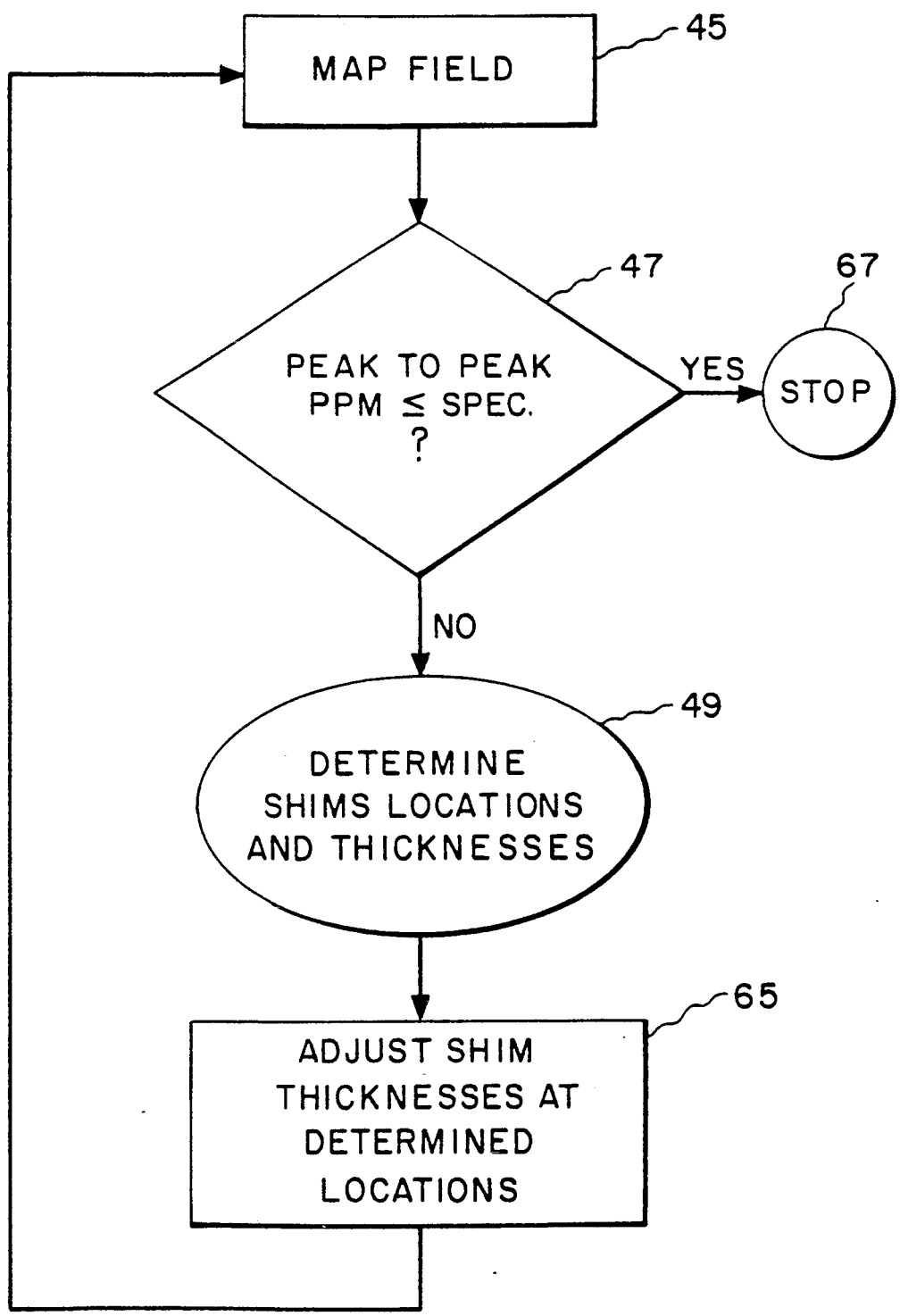
FIG. 4 is a flow chart showing another embodiment of the present invention.
Figure 5:
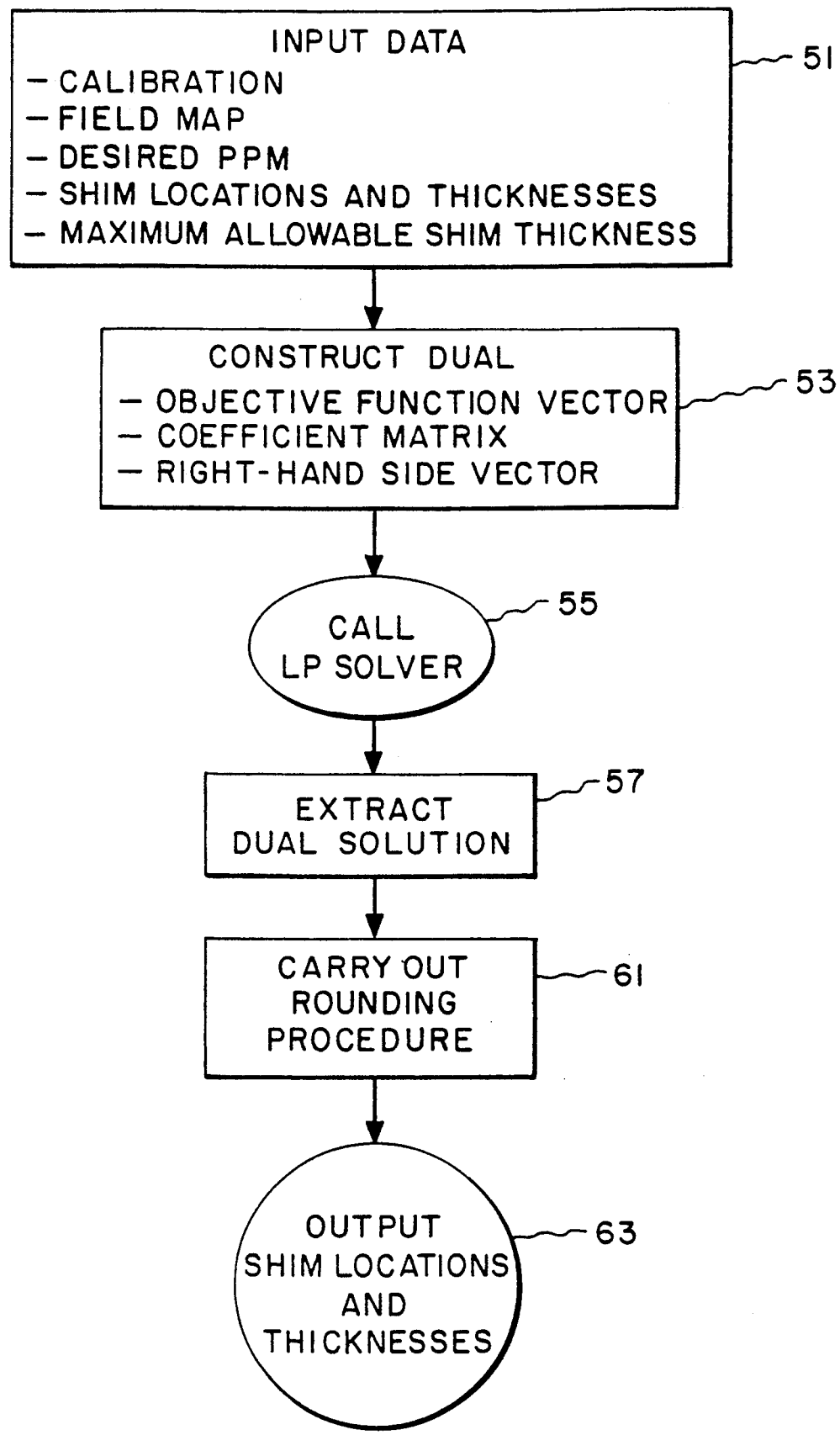
FIG. 5 is a flow chart showing the step of determining the thickness and location of the shims in more detail in accordance with the present invention.

Another embodiment of the present invention, shown in FIGS. 4 and 5, provides a maximum shim thickness and permits shim removal as well as shim placement in subsequent iterations. The objective function used, shown in equation 9, as well as the first two constraints equations 10 and 11 remains unchanged from the previous embodiment. Additional constraints are provided and are shown in equations 12 and 13.

$$\text{MINIMIZE} \sum_{i=1}^{N} AX_i + T \tag{9}$$

$$\text{SUBJECT TO: } \sum_{i=1}^{N} \Delta B_{i,j} X_i + BM_j - BMEAN \leq \frac{E}{2} - \frac{T}{2} \; j = 1 \text{ to } M \tag{10}$$

$$\sum_{i=1}^{N} \Delta B_{i,j} X_i + BM_j - BMEAN \geq -\frac{E}{2} - \frac{T}{2} \; j = 1 \text{ to } M \tag{11}$$

$$X_i \leq S_i \; i = 1 \text{ to } N \tag{12}$$

$$X_k \geq -t_k \; k \text{ is a subset of 1 to } N \tag{13}$$

$$X_e \geq 0 \; e \neq k \; e \text{ is a subset of 1 to } N \tag{14}$$

$X_k$ is unrestricted in sign k is a subset of 1 to N (15)

$BMEAN \geq 0$ (16)

$T \geq 0$ (17)

Equation 12 provides that all the shim thicknesses $X_i$ are going to be less than or equal to a maximum thickness $S_i$ at each of the N locations. The value of $S_i$ is reduced by the amount of shim present at each of the locations which were placed there by previous iterations. The k locations, where k is a subset of N, are those locations where the shim amount already present can be reduced. $t_k$ is the shim thickness already present at location k. Equation 13 checks that the amount of shim being removed is not greater than the amount already there. $X_e$ represents those locations where the shim amounts are going to remain unchanged or be increased. All the $X_e$ and $X_k$ locations are mutually exclusive and together make up the N locations. The $X_k$ locations are the only ones which can be negative in sign. There are 302 variables and 928 to 1228 constraints. The number of constraints depend on the number of locations at which shims are to be reduced. Equations 14, 15, 16 and 17 are true but not constraints used in defining the primal since variables are normally nonnegative. The linear programming problem represented by the equations 9-13 cannot be solved without modification because of the unrestricted sign of variable $X_k$. The dual shown in equations 18-22 however, does not have any variables with unrestricted sign. The dual solution of the dual is the primal solution.

$$\text{MAXIMIZE} \sum_{j=1}^{M} \left[ \left( BM_j - \frac{E}{2} \right) Y_j - \left( BM_j + \frac{E}{2} \right) Y_{M+j} \right] - \sum_{i=1}^{N} S_i Y_{2M+i} - \sum_k t_k Y_{2M+N+k} \tag{18}$$

$$\text{SUBJECT TO: } -\sum_{j=1}^{M} [\Delta B_{i,j} (Y_j - Y_{M+j})] - Y_{2M+i} \leq A \; i \text{ is a subset of 1 to } N \tag{19}$$

$$-\sum_{j=1}^{M} [\Delta B_{k,j} (Y_j - Y_{M+j})] - Y_{2M+k} + Y_{2M+N+k} = A \; k \neq i \; k \text{ is a subset of 1 to } N \tag{20}$$

$$\sum_{j=1}^{M} (Y_j - Y_{M+j}) \leq 0 \tag{21}$$

$$\sum_{j=1}^{2M} \frac{1}{2} Y_j \leq 0 \tag{22}$$

All Y's $\geq 0$ (23)

A flow chart showing the steps of this embodiment of the invention is shown in FIGS. 4 and 5. As in the previous embodiment the field is mapped and the field inhomogeneity checked in block 45 and 47, respectively. The shim location and thicknesses are determined in block 49 using the steps shown in FIG. 5. The input data supplied in block 51 of FIG. 5 is the same as previously used with the addition of thicknesses of shims at any of the shim locations when the field was mapped and the maximum allowable shim thickness. The dual is constructed in block 53 and the dual solution of the dual problem is extracted in block 57.

The rounding procedure is performed in block 61 with the decision to round up or down determined by which gives the least inhomogeneity. The shim locations and thicknesses are available in block 63 and in block 65 of FIG. 4. Negative thicknesses indicate the thickness of the shims at a particular location should be reduced.

The field is again mapped with the adjusted shim thicknesses at their determined locations in block 45. If the ppm is still not the desired level, the effect of a predetermined thickness of shim at each of the 300 positions in the bore of the magnet with the shims positions and thicknesses found so far present in the magnet can be determined to help in achieving very low inhomogeneity rather than rely on data found for a different magnet of the same design.

The shim locations and thicknesses are adjusted and the field again mapped. When the desired inhomogeneity is reached the method is completed in block 67.

As an alternative to determining shim thickness in the embodiments, shim weight or shim volume can be determined using the same equations.

Field inhomogeneity was measured in terms of global peak to peak inhomogeneity. Other measures of inhomogeneity such as average or filled gradient inhomogeneity can alternatively be minimized.

The embodiment shown in FIGS. 2 and 3 has been used to successfully shim a number 0.5T MR imaging magnets having an initial inhomogeneity of greater than 300 ppm peak to peak. Homogeneities of less than 10 ppm was achieved in all cases.

The foregoing has described a method of shimming magnets using only passive shims and which minimizes global peak to peak magnetic field inhomogeneity.

While the invention has been described with respect to several preferred embodiments thereof, it will be understood by those skilled in the art that various changes in form and detail may be made without departing from the spirit and scope of the invention.

What is claimed is:

1. A method of passively shimming a magnet having a central bore, comprising the steps of:
   a) measuring the field strength in the bore of the magnet at a predetermined number of points;
   b) determining the field inhomogeneity from the measured field strengths;
   c) determining the fields created by a single shim of known size when positioned at different predetermined positions in the bore of the magnet;
   d) determining the shim locations in the bore of the magnet and shim size using a linear programming solver to minimize the field inhomogeneity and total amount of shims used, the shim size being determined based on the measured field in the bore of the magnet and the field created by a single shim when positioned at a predetermined number of positions;
   e) adjusting the shim size at the appropriate location to the determined values;
   f) measuring the field strength of the magnet with shims in position at the predetermined number of points in the magnet;
   g) determining the field inhomogeneity from the measured field strengths;
   h) comparing the field inhomogeneity to a desired value; and
   i) repeating steps d, e, f, g, and h until the field inhomogeneity is less than or equal to the desired inhomogeneity.

2. The method of claim 1 wherein the step of determining the shim location in the bore of the magnet and shim further comprises changing the importance of minimizing the total amount of shims relative to the importance of minimizing the inhomogeneity, with smaller measured field inhomogeneities increasing the importance given minimizing the total amount of shims.

3. The method of claim 1 wherein the field inhomogeneity is measured in terms of the global peak to peak field inhomogeneity and the global peak to peak field inhomogeneity is minimized when the shim placement and shim size are determined.

4. The method of claim 1 wherein shim size comprises a fixed length and width and varying thicknesses, with the appropriate shim thicknesses determined at each location.

5. A method of shimming a magnet having passive shims, comprising the steps of:
   a) measuring the field strength in the bore of the magnet at a predetermined number of points;
   b) determining the field inhomogeneity from the measured field strengths;
   c) determining the fields created by a single shim of known length, width and thickness when positioned at different predetermined positions in the bore of the magnet;
   d) determining the shim location in the bore of the magnet and shim thickness of a fixed length and width shim using a linear programming solver to minimize the field inhomogeneity and total amount of shims, the shim thicknesses being determined based on the field measured in the bore of the magnet and the field created by a single shim of known size when positioned at different locations inside the magnet bore, with the shim thicknesses constrained to a maximum value less the shim thicknesses already present at a particular location when the field strength in the bore of the magnet was measured;
   e) adjusting the shim size at the appropriate location to the determined values;
   f) measuring the field strength of the magnet with shims in position at the predetermined number of points in the magnet;
   g) determining the field inhomogeneity from the measured field strengths;
   h) comparing the field inhomogeneity to a desired value; and
   i) repeating steps d, e, f, g, and h until the inhomogeneity is less than or equal the desired inhomogeneity.

6. The method of claim 5 wherein the step of determining the shim location in the bore of the magnet and shim thickness further comprises changing the importance of minimizing the total amount of shims relative to the importance of minimizing the inhomogeneity with smaller measured field inhomogeneities increasing the importance given minimizing the total amount of shims.

7. The method of claim 5 wherein the field inhomogeneities is measured in terms of the global peak to peak field inhomogeneity and the global peak to peak field inhomogeneity is minimized when the shim placement and shim thickness are determined.

* * * * *